United States Patent
Hjelm

(10) Patent No.: US 7,436,249 B2
(45) Date of Patent: Oct. 14, 2008

(54) CIRCUIT AND METHOD FOR FILTERING A RADIO FREQUENCY SIGNAL

(75) Inventor: Mikael Hjelm, Vaestras (SE)

(73) Assignee: Infineon Technologies AG, Munich (DE)

( * ) Notice: Subject to any disclaimer, the term of this patent is extended or adjusted under 35 U.S.C. 154(b) by 9 days.

(21) Appl. No.: 11/507,949

(22) Filed: Aug. 22, 2006

(65) Prior Publication Data

US 2007/0054647 A1    Mar. 8, 2007

(30) Foreign Application Priority Data

Aug. 22, 2005    (EP)    ................... 05018188

(51) Int. Cl.
*H03K 5/00*    (2006.01)

(52) U.S. Cl. ..................... 327/552; 327/551

(58) Field of Classification Search ............ 327/311, 327/551–559
See application file for complete search history.

(56) References Cited

U.S. PATENT DOCUMENTS

| | | |
|---|---|---|
| 3,564,441 A | 2/1971 | Eide |
| 3,849,677 A | 11/1974 | Stacey et al. |
| 4,078,205 A | 3/1978 | Van Schoiack |
| 4,433,315 A * | 2/1984 | Vandegraaf ............... 333/174 |
| 5,548,165 A | 8/1996 | Mohan et al. |

OTHER PUBLICATIONS

Peng, Fang Z. and Donald J. Adams. "Harmonic Sources and Filtering Approaches-Series/Parallel, Active/Passive, and Their Combined Power Filters." Conference Record-IEEE Industry Applications Society 34th Annual Meeting: Phoenix, Arizona, Oct. 1999. (pp. 448-455).
Wenzel Associates, Inc. "Finesse Voltage Regulator Noise!" XP002364872, Jan. 2001. <www.wenzel.com/documents/finesse.html> (pp. 1-4).

* cited by examiner

*Primary Examiner*—Dinh T. Le
(74) *Attorney, Agent, or Firm*—Maginot, Moore & Beck

(57) ABSTRACT

A circuit for filtering a radio frequency signal at a given frequency comprises an input terminal, a filter device, and an active AC shunt circuit having first and second input terminals and an output terminal, where the first input terminal of the active AC shunt circuit is connected to the input terminal. The filter device is connected between the input terminal and the second input terminal of the active AC shunt circuit, and is provided for attenuating the radio frequency signal at the given frequency to the second input terminal of the active AC shunt circuit. The active AC shunt circuit is provided for shunting a signal at a frequency other than the given frequency as contained in the radio frequency signal to ground, and for outputting the radio frequency signal as filtered at its output terminal.

14 Claims, 6 Drawing Sheets

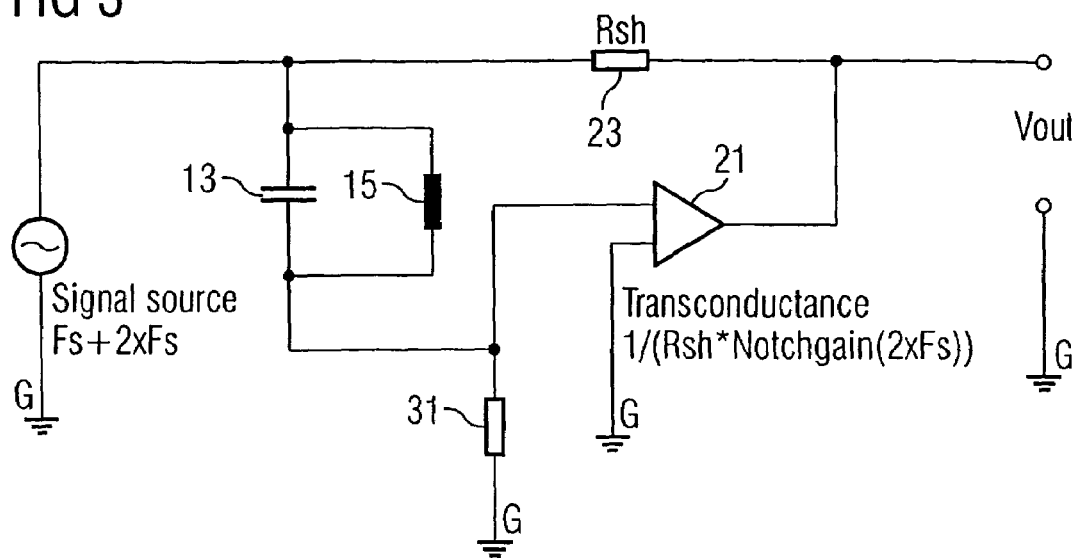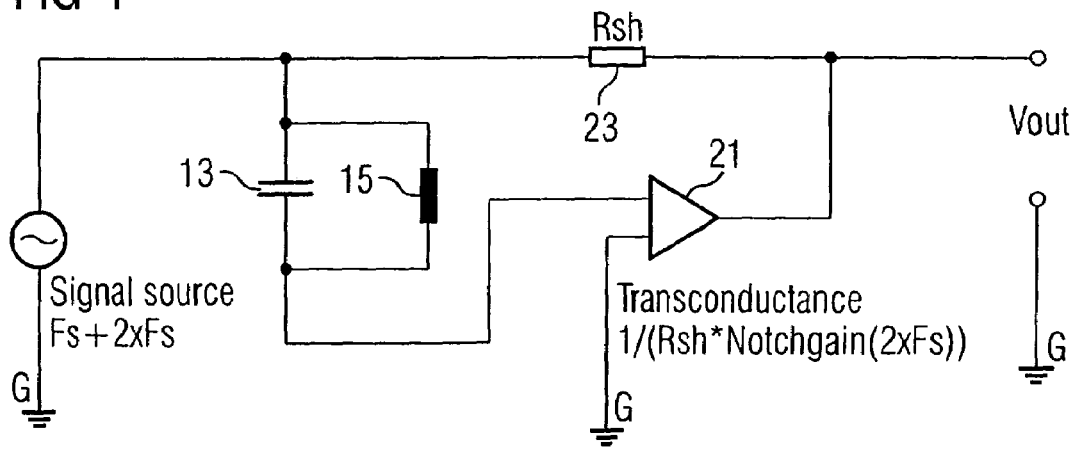

CIRCUIT AND METHOD FOR FILTERING A RADIO FREQUENCY SIGNAL

CROSS-REFERENCE TO RELATED APPLICATIONS

This application claims priority from European Patent Application No. 05018188.2, which was filed on Aug. 22, 2005, and is incorporated herein by reference in its entirety.

FIELD

The present invention generally relates to filters for radio frequency (RF) signals.

BACKGROUND

Various kinds of active and passive RF and microwave filters are used in telecommunications devices to reject out-of-band signals, filter undesired harmonics and spurious components from signals prior to transmission and for performing various other functions within the telecommunications devices.

In particular, a Group Switched Mobile (GSM) filter may be required in the output of the transmitter for GSM transceivers and a Digital Cellular System (DCS) filter may be required in the output of the transmitter for DCS transceivers. Both are typically required for a dual-mode telecommunications transceiver. Similar filters may also be needed in wireless local area network (WLAN) and wireless personal area network (WPAN) devices, such as Bluetooth and 802.11 devices, for e.g. attenuation of the second harmonic of the signal source. The above-mentioned filters occupy a significant amount of circuit board area and package volume within the transceiver.

SUMMARY

In accordance with one embodiment of the present invention, a circuit is provided for filtering a radio frequency signal, wherein the circuit has: an input terminal, a filter device, and an active AC shunt circuit having first and second input terminals and an output terminal, wherein the first input terminal of the active AC shunt circuit is connected to the input terminal, the filter device is connected between the input terminal and the second input terminal of the active AC shunt circuit, and is provided for attenuating the radio frequency signal at a given frequency to the second input terminal of the active AC shunt circuit, and the active AC shunt circuit is provided for shunting a signal at a frequency other than the given frequency as contained in the radio frequency signal to ground, and for outputting the radio frequency signal as filtered at its output terminal.

In accordance with another embodiment of the present invention, a method is provided for filtering a radio frequency signal, with the steps of: receiving the radio frequency signal, attenuating the radio frequency signal at a given frequency by means of a filter device, shunting a signal at a frequency other than the given frequency as contained in the radio frequency signal to ground by means of an active AC shunt circuit, and outputting the radio frequency signal as filtered.

Small size and light weight components are critical to reducing the size of telecommunications transceivers and the F trend is toward progressively smaller devices. Therefore, it would be desirable to reduce the size of required filters within telecommunications transceivers and further desirable to provide such reduction in narrow band applications such as for example WLAN and Bluetooth applications.

In some instances the filter may be dispensed with, and instead a signal source having high linearity is provided so that the signal quality, i.e. the attenuation of the second harmonic, is sufficiently good without any kind of filtration. However, such solution puts very high demands on the signal source: it would be more complex and expensive and/or higher power consumption would be required. Therefore, it would be desirable to provide a simple but yet efficient filter in order to relax the demands on the signal source.

Furthermore, it would be desirable to provide a filter which is accurate, precise, straightforward to design and implement, and of low cost. Yet another desirable feature would be to provide a method for filtering a radio frequency signal by means of such a filter.

In one embodiment of the present invention, a circuit for filtering a radio frequency signal comprises an input terminal, a filter device, an active AC shunt circuit and an output terminal. The input terminal is connected to the filter device and to a first input terminal of the shunt circuit. The filter device is connected to a second input terminal of the shunt circuit, and is provided for attenuating or blocking the radio frequency signal at a given frequency to the second input terminal of the shunt circuit. The shunt circuit is provided for shunting a signal at a frequency other than the given frequency as contained in the radio frequency signal to ground (e.g. a second harmonic of the radio frequency signal at the given frequency), and for outputting the radio frequency signal as filtered at the output terminal.

Hereby a filter circuit is obtained, which is highly efficient and which occupies small space. An attenuation of a second harmonic at 4.9 GHz of about 50 dB is achievable. The simple and small structure allows for the fabrication of small transmitters and transceivers. The filter circuit is further easily ingratable with a power amplifier or other transmitter or transceiver circuitry on a single chip.

The filter device comprises preferably one or two resonant circuits: one for blocking the radio frequency signal at the given frequency from reaching the shunt circuit and/or one connected between the shunt circuit and ground for allowing the radio frequency signal at the given frequency to be shunted to ground, while the signal at the frequency other than the given frequency is blocked and thus directed to the shunt circuit. Each of the resonant circuits is preferably an LC-based circuit. By the provision of two resonator structures, one notch filter circuit and one band pass filter circuit strong attenuation of the second harmonic is achieved at the output terminal while the first harmonic is left essentially non-attenuated.

The shunt circuit, which is known per se in the field of shunting AC noise to ground in voltage regulators, comprises preferably a transconductance or transimpedance amplifier and a load resistor. The first input terminal of the shunt circuit is connected to the load resistor, whereas the second input terminal of the shunt circuit is connected to the transconductance amplifier. The transconductance amplifier and the load resistor are interconnected at the output terminal. By such shunt circuit or current sink the second harmonic current is efficiently shunted to ground.

The filter circuit of an embodiment of the present invention is primarily, but not exclusively, intended for use in transmitters in narrow band applications such as WLAN and Bluetooth transmitters.

Further characteristics of various embodiments of the invention and advantages thereof will be evident from the detailed description of preferred embodiments of the present invention given hereinafter and the accompanying FIGS. 1-6, which are only given by way of illustration, and thus are not limitative of the present invention.

BRIEF DESCRIPTION OF THE DRAWINGS

These and other advantages and features of embodiments of the present invention will become clear from the following description taken in conjunction with the accompanying drawings, in which:

FIGS. 1-4 illustrate various circuits for filtering a radio frequency signal according to different embodiments of the present invention;

DESCRIPTION OF THE PREFERRED EMBODIMENTS

Figure 1:
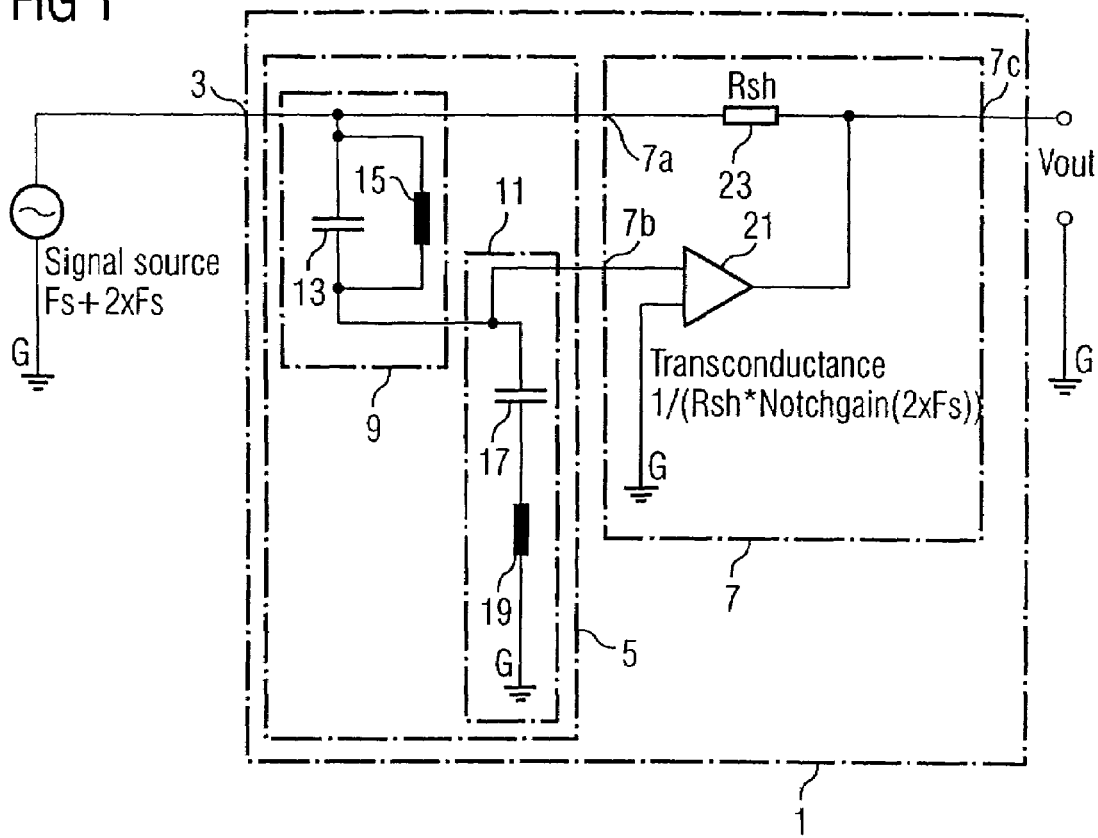

A filter circuit 1 for filtering a radio frequency signal according to an embodiment of the invention is shown in FIG. 1. The filter circuit 1 comprises an input terminal 3, a filter device 5, and an active AC shunt circuit 7 having first 7*a* and second 7*b* input terminals and an output terminal 7*c*, wherein the first input terminal 7*a* is connected to the input terminal 3 of the filter circuit 1 and the output terminal 7*c* coincides with the output terminal of the filter circuit 1.

The filter device 5 comprises two resonant circuits 9, 11, of which one is a notch filter 9 and one is a band pass filter 11. The notch filter 9 is connected between the input terminal 3 and the second input terminal 7*b* of the active AC shunt circuit 7, and comprises a capacitor 13 and an inductor 15 connected in parallel. The band pass filter 11 is connected between the second input terminal 7*b* of the active AC shunt circuit 7 and ground G, and comprises a capacitor 17 and an inductor 19 connected in series.

The active AC shunt circuit 7 comprises a transconductance or transimpedance amplifier 21 and a resistor 23, wherein the first input terminal 7*a* of the active AC shunt circuit 7 is connected to the resistor 23 and the second input terminal 7*b* of the active AC shunt circuit 7 is connected to a first input terminal 21*a* of the transconductance amplifier 21. A second input terminal 21*b* of the transconductance amplifier 21 is connected to ground G. The resistor is connected to an output terminal of the transconductance amplifier 21 at the output terminal 7*c* of the active AC shunt circuit 7.

Figure 5A:
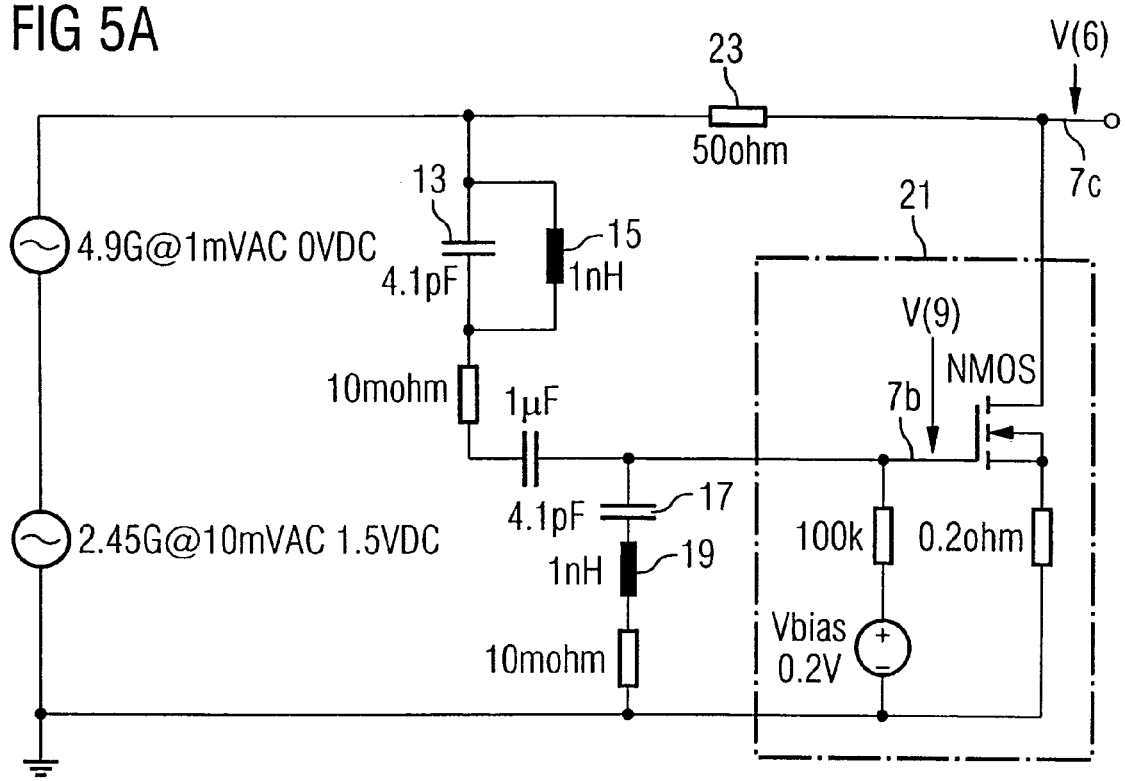
FIGS. 5*a-d* illustrate an example implementation of the circuit of FIG. 1 together with simulated results.

The active AC shunt circuit 7 is known in the art per se, see e.g. the article Finesse Voltage Regulator Noise, which was publicly available on the Internet page http://www.wenzel.com/documents/finesse.html of Wenzel Associates Inc. on Aug. 10, 2005. However, the circuit is here used as a voltage regulator for removing noise. An example implementation of an active AC shunt circuit 7 for use in the disclosed embodiment of the present invention is detailed in FIG. 5*a*.

The operation of the filter circuit 1 is straightforward. The notch filter 9 blocks the radio frequency signal at a given or desired frequency, while other frequency components of the signal including the second harmonic are passed through. The band pass filter 11 allows the radio frequency signal at the given frequency to be shunted to ground G, while the other frequency components, including the second harmonic, are effectively blocked and directed towards the first input terminal 21*a* of the transconductance amplifier 21.

The active AC shunt circuit 7 shunts the other frequency components of the signal, including the second harmonic, to ground G, and outputs at its output terminal 7*c* the radio frequency signal as filtered.

By providing the resistor 23 in series with the output terminal 21*c* of the circuit and assuming that a circuit reduces the second harmonic voltage V at the load to zero, the second harmonic current from the circuit may be calculated as V/R, where R is the resistance of the resistor 23. If a current-sink can be designed to sink this amount of second harmonic current to ground at the load, no second harmonic current will flow in the load. By amplifying the second harmonic with a transconductance amplifier with a suitable gain, the required current sink is realized. The required transconductance is —1/$(R*V_G)$ where $V_G$ is the voltage gain in the resonant filter device 5 at the second harmonic frequency or whatever frequency component the circuit is designed to filter away.

Figure 2:
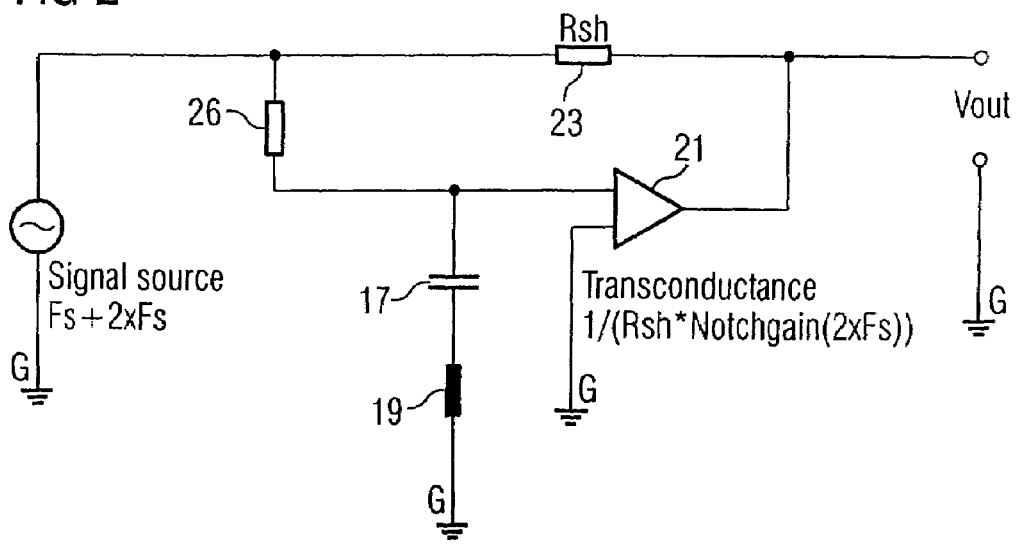

FIGS. 2-4 illustrate various modified circuits for filtering a radio frequency signal according to alternative embodiments of the invention, which differ from the embodiment in FIG. 1 regarding the filter device 5. In the circuit of FIG. 2 the notch filter 9 is exchanged for a resistor 26, in the circuit of FIG. 3 the band pass filter 11 connected to ground G is exchanged for a resistor 31, and in the circuit of FIG. 3 the band pass filter has been removed in its entirety. It shall be appreciated that while the embodiments of FIG. 2-4 are simpler and smaller than the circuit if FIG. 1 they have also less capability of strong attenuation of e.g. the second harmonic.

FIGS. 5*a-d* illustrate an example implementation of the circuit of FIG. 1 together with simulated results. The circuit was connected to a signal source that transmitted 1.5 V DC, 10 mV AC at 2.45 GHz, and 1 mV AC at 4.90 GHz, the latter being referred to as the error signal. In the example the error signal had 10 times lower amplitude than that of the signal at the desired frequency, 2.45 GHz. Values of the resistances, capacitances, and inductances are given in FIG. 5*a*. The transistor of the transconductance amplifier 21 was an NMOS transistor with a transconductance parameter $k_p$=17 □A/V², a threshold voltage $V_t$=0.1 V, a length l=0.13 □m, and a width w=410 □m. Two nodes are indicated: V (9) at the input terminal 7*b* of the NMOS transistor and V (6) at the output terminal 7*c* of the filter circuit.

Figure 5B:
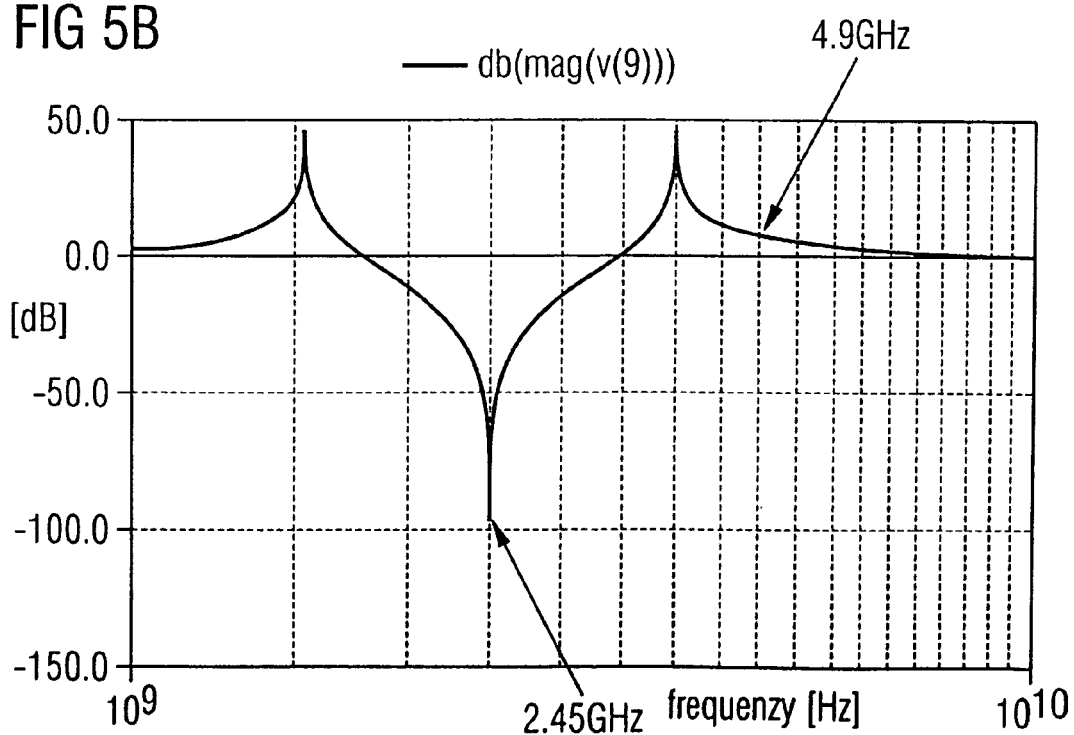
Figure 5C:
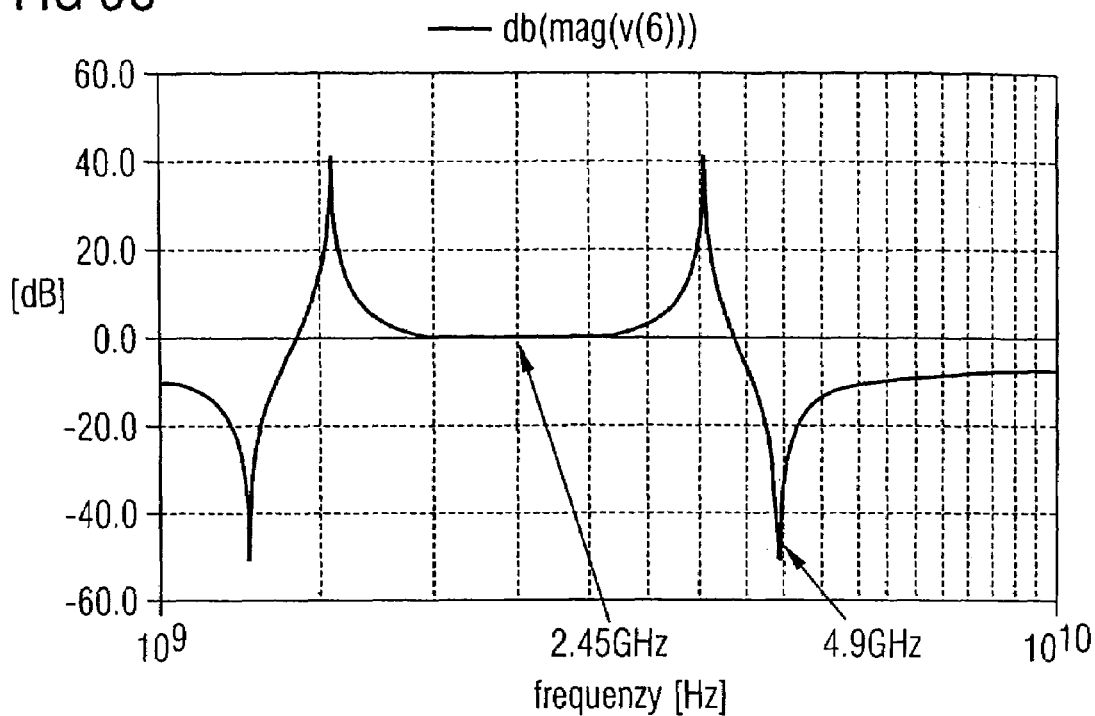
Figure 5D:
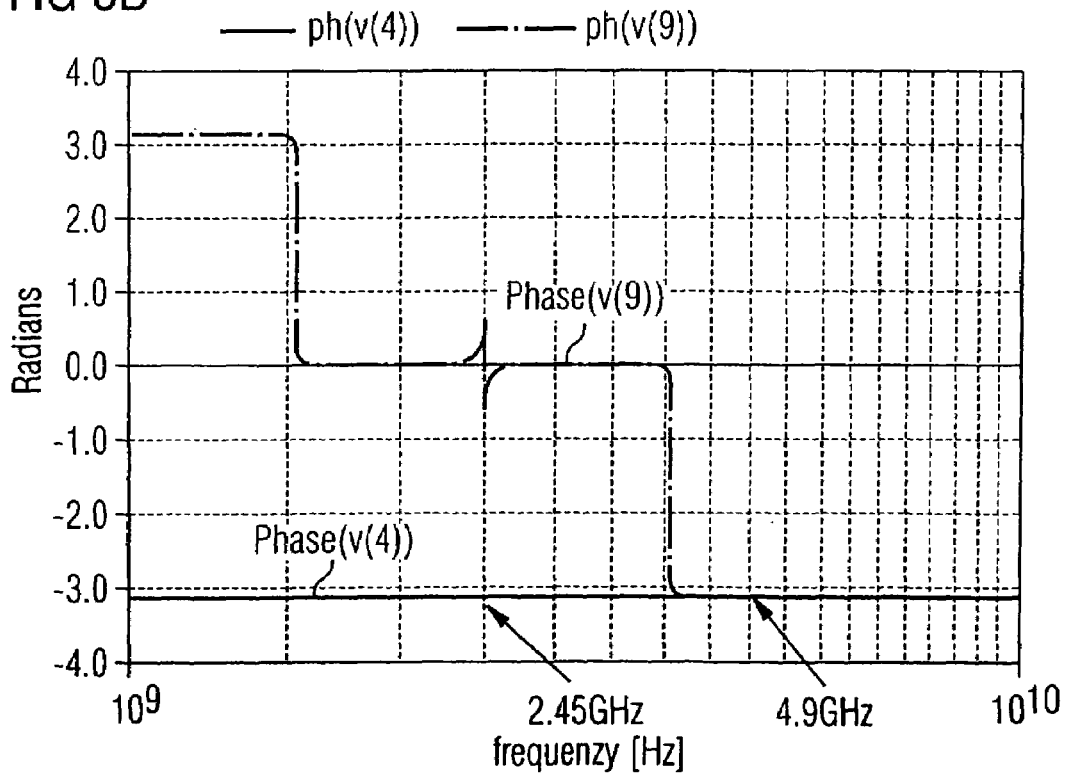

FIGS. 5*b* and *c* show the filter response in dB at the nodes V (9) and V (6). From FIG. 5*b* it can be seen that the response was not flat outside of the blocked frequency. The gain of the transconductance amplifier had to be adjusted such that the filter attenuation obtained a maximum at the desired frequency, i.e. 2.45 GHz. From FIG. 5*c* it can be seen that the attenuation of the second harmonic by the filter circuit was about 50 dB, whereas the attenuation at the desired frequency was small. FIG. 5*d* shows the phase of the error signal and of the signal at the node V (9). As can bee seen the phase of the error signal and of the V (9) signal was very close, which made it possible to cancel out the error signal almost completely.

Simulations on another similar example implementation but with wider resonant filters (not illustrated) showed less efficiency since the cancellation current came out of phase with the voltage that was to be cancelled. An attenuation of the second harmonic by the filter circuit of about 10 dB was achieved.

Figure 6A:
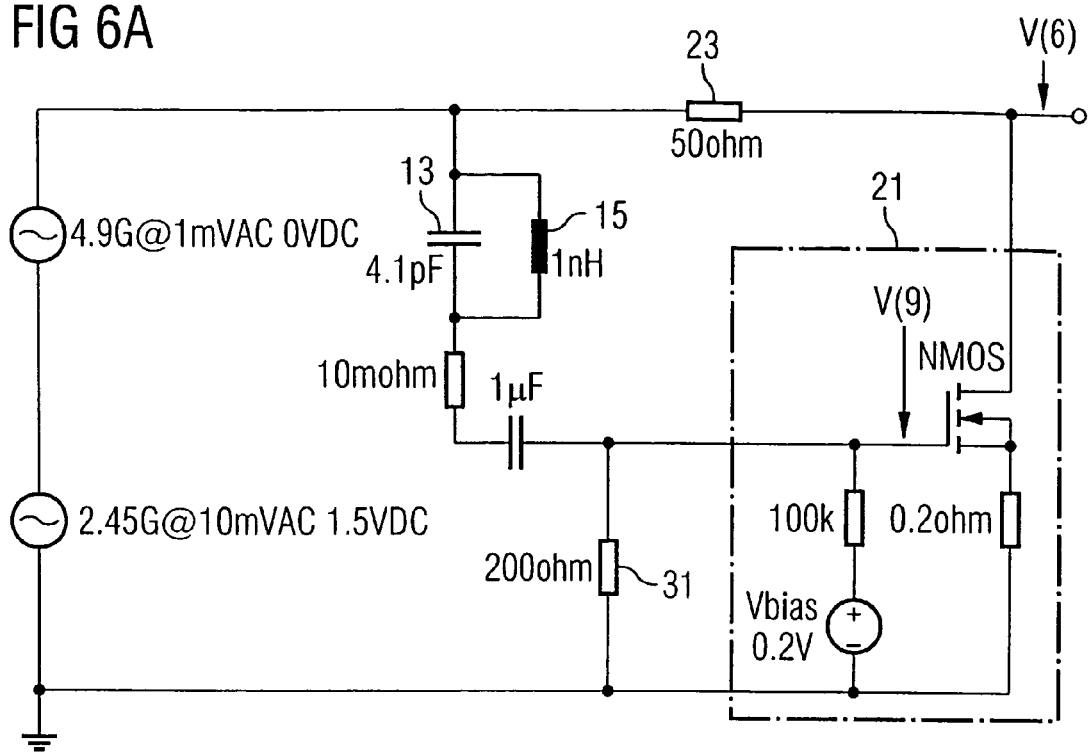
FIGS. 6*a-c* illustrate an example implementation of the circuit of FIG. 3 together with simulated results.
Figure 6B:
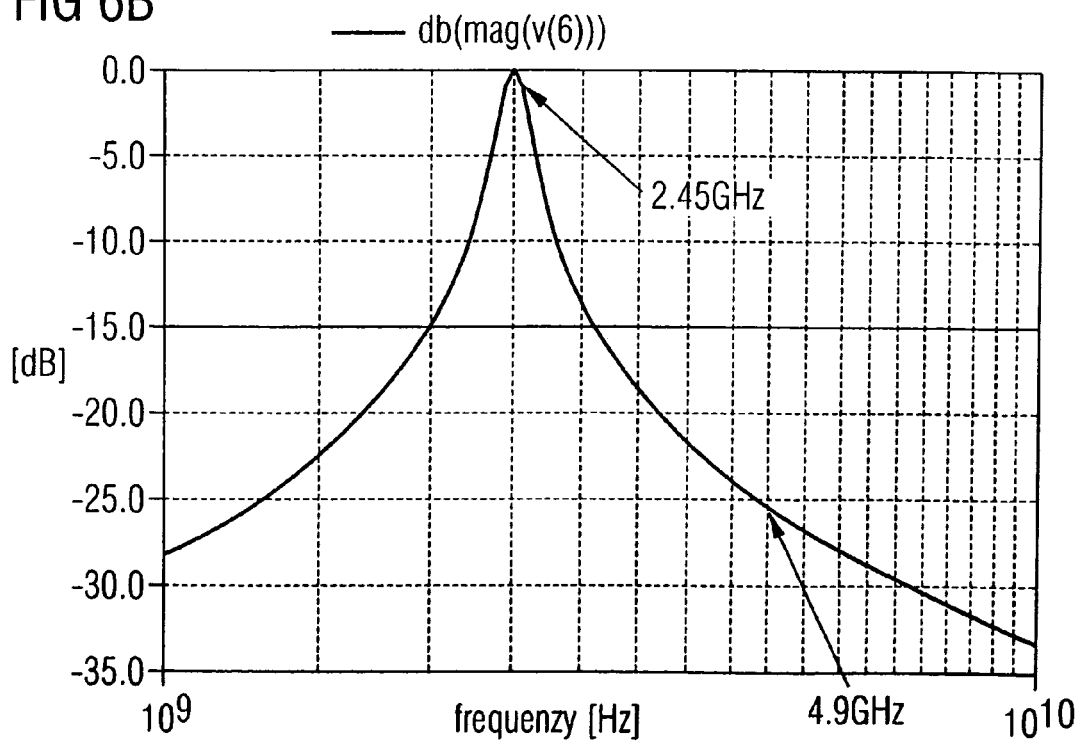
Figure 6C:
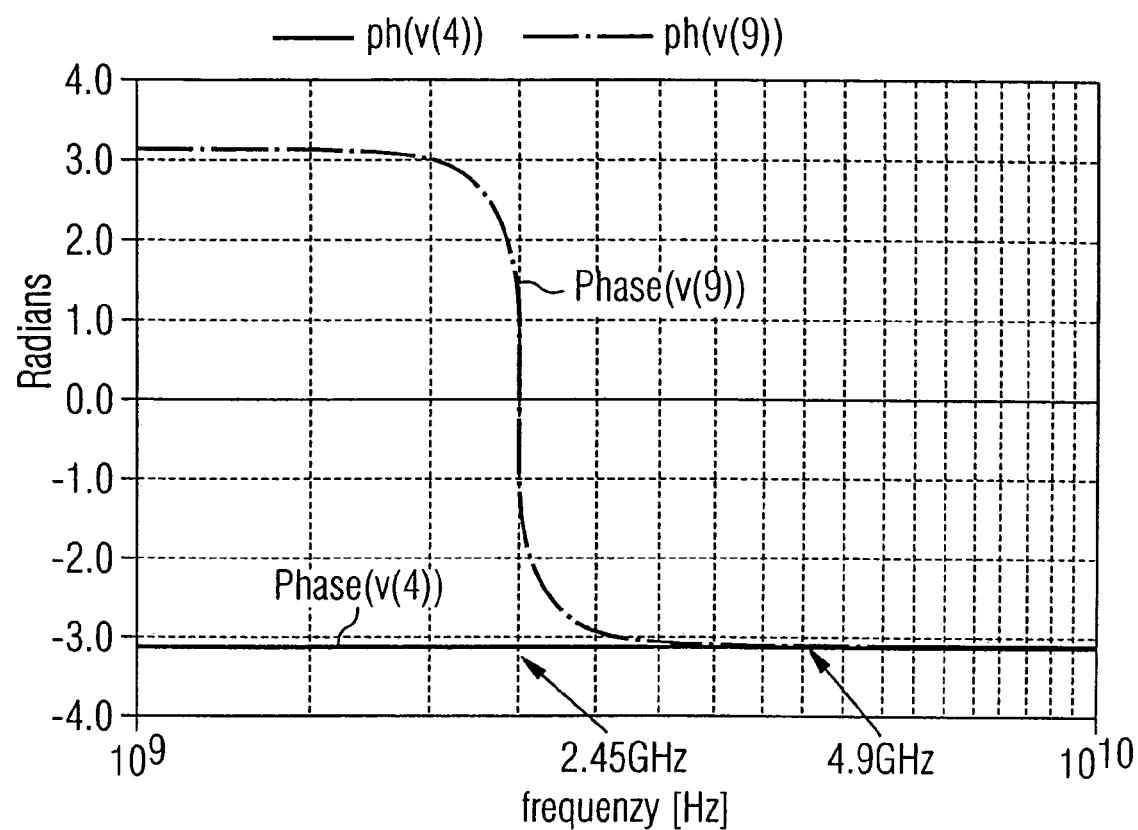

FIGS. 6*a-c* illustrate an example implementation of the circuit of FIG. 3 together with simulated results. The example implementation differs from the one of FIG. 5*a* in that the capacitor 17 and the inductor 19 as comprised in the band pass filter and a small resistor of 10 mohm are exchanged for a larger resistor of 200 ohm.

FIG. 6*b* shows the filter response in dB at the node V (6) at the output terminal 7*c* of the filter circuit. It can be seen that the attenuation of the second harmonic by the filter circuit was about 25 dB, whereas the attenuation at the desired frequency was small. FIG. 6*b* shows the phase of the error signal and of the signal at the node V (9). The less optimum filtering was due to the phase difference as seen at 4.9 GHz. The filtering is less efficient by this example implementation, but may be still be acceptable as a compromise to reduce component cost and complexity of matching.

The filter circuit 1 may be provided in e.g. a radio transmitter, receiver, or transceiver or in a clock or oscillator circuit. It may be designed to filter widely or narrowly and strongly or weakly. The maximum attenuation was selected to be at the frequency of the second harmonic in the examples above. However, in other applications the maximum attenuation may be selected to be at another frequency or frequencies depending on the particular application.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A circuit for filtering a radio frequency signal, wherein said circuit comprises:
   a circuit input terminal;
   an active AC shunt circuit including a first input terminal, a second input terminal and an output terminal, wherein the first input terminal of said active AC shunt circuit is connected to said circuit input terminal; and
   a filter device connected between said circuit input terminal and the second input terminal of said active AC shunt circuit, wherein the filter device is configured to attenuate the radio frequency signal at a first frequency to the second input terminal of said active AC shunt circuit, the filter device comprising at least one of a resonant circuit or a notch filter configured to block the radio frequency signal at the first frequency;
   wherein said active AC shunt circuit is configured to shunt a signal at a second frequency contained in said radio frequency signal other than said first frequency to ground, and is further configured to output the radio frequency signal as filtered at said output terminal.

2. The circuit of claim 1 wherein said notch filter comprises a capacitor and an inductor connected in parallel.

3. The circuit of claim 1 wherein said filter device is connected to ground.

4. The circuit of claim 1 wherein said filter device comprises a band pass filter connected to ground and configured to allow the radio frequency signal at the first frequency to be shunted to ground.

5. The circuit of claim 4 wherein said band pass filter comprises a capacitor and an inductor connected in series.

6. The circuit of claim 1 wherein said active AC shunt circuit comprises a transconductance amplifier and a resistor, the resistor connected between the first input terminal of said active AC shunt circuit and the output terminal of said active AC shunt circuit, and the transconductance amplifier connected between the second input terminal of said active AC shunt circuit and the output terminal of said active AC shunt circuit.

7. The circuit of claim 1 wherein said signal at the second frequency is the second harmonic of said radio frequency signal at the first frequency.

8. The circuit of claim 1 wherein said circuit is provided in a radio transmitter, receiver, or transceiver.

9. A method for filtering a radio frequency signal, the method comprising the steps of:
   a) receiving said radio frequency signal at a first terminal of a filter device;
   b) attenuating the radio frequency signal at a first frequency by means of the filter device, wherein said filter device comprises at least one of a resonant circuit or a notch filter configured to block the radio frequency signal at the first frequency;
   c) shunting a signal at a second frequency other than said first frequency as included in said radio frequency signal to ground by means of an active AC shunt circuit having a first input configured to receive said radio frequency signal and a second input signal operably connected to a second terminal of said filter device; and
   d) outputting a filtered radio frequency signal of the active AC shunt circuit at an output of the filter device.

10. The method of claim 9 wherein the radio frequency signal is attenuated at the first frequency by means of a passive resonant circuit of said filter device.

11. The method of claim 9 wherein the signal at the second frequency other than said given frequency is shunted to ground by means of a transconductance or transimpedance amplifier and a resistor.

12. A circuit for filtering a radio frequency signal, the circuit comprising:
   a) a circuit input configured to receive said radio frequency signal;
   b) means for filtering the radio frequency signal by attenuating the radio frequency signal at a given frequency, the means for filtering comprising at least one of a resonant circuit or a notch filter configured to block the radio frequency signal at the given frequency; and
   c) means for shunting a signal at a frequency other than said given frequency, as included in said radio frequency signal, to ground, wherein the means for filtering is connected between said circuit input and the means for shunting and wherein said means for shunting includes a first input operably connected to said circuit input, a second input operably connected to said means for filtering; and
   d) an output configured to output the filtered radio frequency signal at output terminal.

13. The circuit of claim 12 wherein the means for filtering includes a passive resonant circuit configured to attenuate the radio frequency signal at the given frequency.

14. The circuit of claim 12 wherein the means for shunting a signal at a frequency other than said given frequency to ground comprises a transconductance amplifier and a resistor.

* * * * *